United States Patent [19]

Lee

[11] 4,040,017

[45] Aug. 2, 1977

[54] INJECTED CHARGE CAPACITOR MEMORY

[75] Inventor: Hsing-San Lee, Williston, Vt.

[73] Assignee: International Business Machines Corporation, Armonk, N.Y.

[21] Appl. No.: 672,198

[22] Filed: Mar. 31, 1976

[51] Int. Cl.² .................. H04N 3/14; H01L 27/14
[52] U.S. Cl. .................. 340/173 R; 340/173 CA; 357/24
[58] Field of Search ............... 357/24; 307/304, 238, 307/221 D; 340/173 CA, 173 R

[56] References Cited

U.S. PATENT DOCUMENTS 3,931,465   1/1976   Levine ........................... 357/24

Primary Examiner—Vincent P. Canney
Attorney, Agent, or Firm—Stephen J. Limanek

[57] ABSTRACT

A semiconductor memory produced in a unipolar technology includes a cell which has an inversion capacitor with one terminal connected to a bit/sense line, the other terminal is coupled to a source of charges by a pulse from a word line. The charges are produced from the source in the form of pulses injected into the capacitor. To provide a word organized array of these cells, each word includes a source of pulsed charges produced at the surface of a semiconductor substrate and a plurality of inversion capacitors are formed also at the surface of the semiconductor in spaced apart relationship from the charge source. Information is written into the capacitors by applying voltages of two different magnitudes, representing 1 and 0 bits of information, to one terminal of the capacitors while a word pulse produces inversion layers at the surface of the substrate between the capacitors to interconnect serially the pulsed charge source with each of the capacitors. The pulses of charge are timed so that they begin at least by the onset of the word pulse and terminate prior to the termination of the word pulse. Furthermore, prior to the termination of the word pulse, the voltage at the charge source is set to form a charge sink for draining excess charges. The capacitors having the larger voltage applied to the one terminal of the capacitors store the greater amount of charge. This charge can then be detected by measuring the voltage of the floating bit sense line when a word pulse again connects the charge source with each of the capacitors.

11 Claims, 5 Drawing Figures

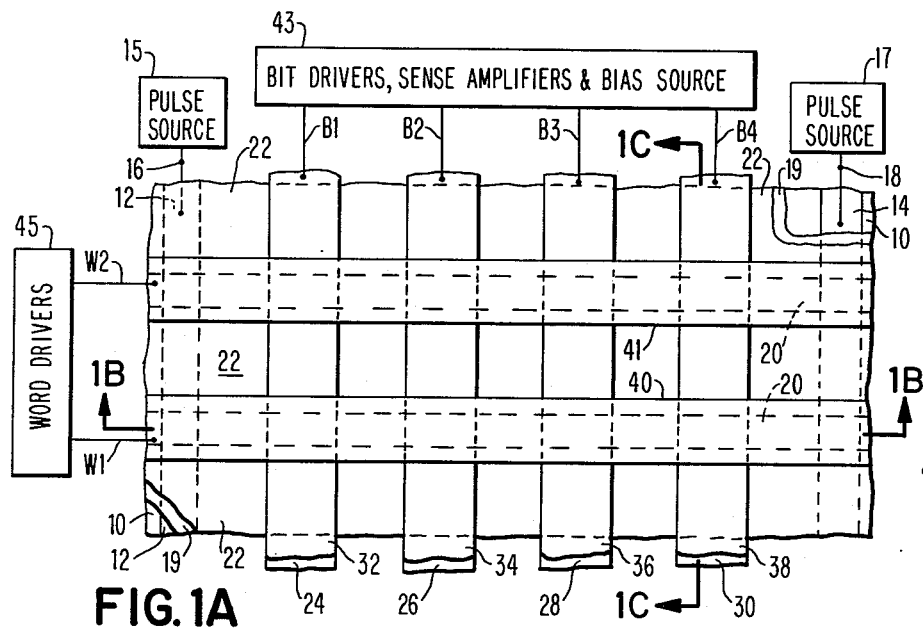
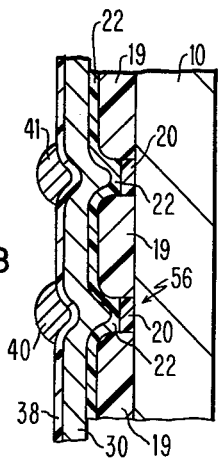
FIG. 1A  FIG. 1C
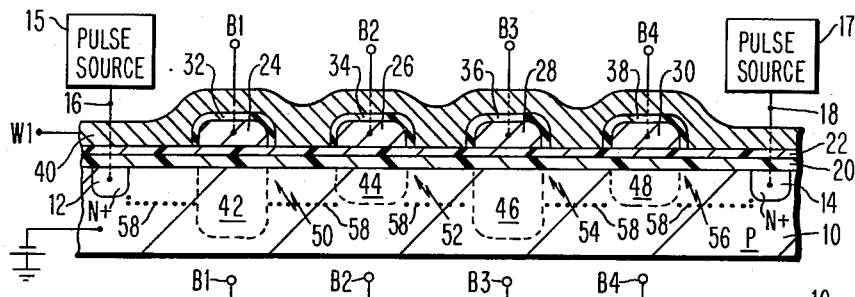
FIG. 1B
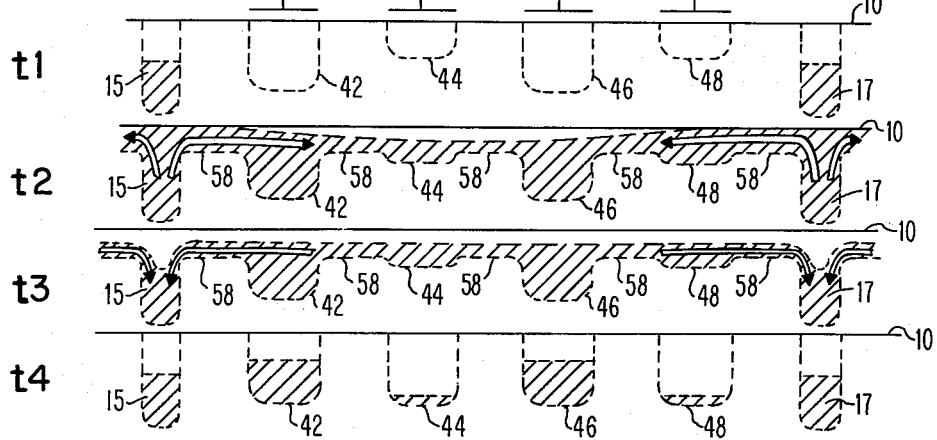
FIG. 2
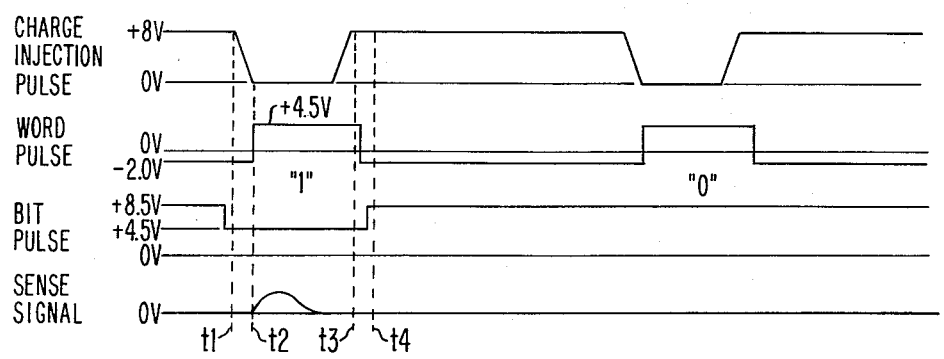
FIG. 3

INJECTED CHARGE CAPACITOR MEMORY

BACKGROUND OF THE INVENTION

1. Field of the Invention

This invention relates to integrated semiconductor memory circuits and more particularly to memory circuits which employ a capacitor for storing binary digits of information.

2. Description of the Prior Art

Integrated semiconductor memory circuits, particularly those employing cells which include essentially a storage capacitor and a switch, have achieved high memory cell densities. One of the simplest circuits for providing small memory cells is described in commonly assigned U.S. Pat. No. 3,387,286, filed July 14, 1967, by R. H. Dennard. Each of these cells employs a storage capacitor and a field effect transistor acting as a switch to selectively connect the capacitor to a bit/sense line. In also commonly assigned U.S. Pats. No. 3,811,076, by W. M. Smith, and U.S. Pat. No. 3,841,926 by R. H. Garnache and W. M. Smith, both filed Jan. 2, 1973, there is disclosed a one device field effect transistor memory cell of the type described in the above identified Dennard patent which is made to a small size by utilizing a layer of doped polycrystalline silicon separated by a dielectric medium disposed on the surface of a semiconductor substrate for forming a storage capacitor. These latter two patents also teach a process which uses very effectively a dual insulation layer of silicon dioxide and silicon nitride.

In commonly assigned copending application having Ser. No. 587,528, filed on June 16, 1975, by W. D. Pricer and J. E. Selleck, there is described a memory array made of small cells which employ storage capacitors and bipolar transistors. In this latter array, which is word organized, each storage capacitor of these cells has simply one capacitor terminal connected to a separate bit/sense line while selected cells forming a word are simultaneously accessed by utilizing a word pulse for coupling to the other terminal of the storage capacitors of that word. By simultaneously accessing the other terminal of all storage capacitors of a particular word, isolation between cells of the word is not required.

In another commonly assigned application having Ser. No. 672,197 entitled "Capacitor Storage Memory", and filed on even date by W. D. Pricer, there is disclosed a capacitor memory produced in a unipolar technology which is provided with very small cells, each of which includes substantially only a storage capacitor having a bit/sense line connected to one terminal of the capacitor and a word line providing a coupling to the other terminal of the capacitor. In an embodiment of that invention, a direct current source of charges is produced at the surface of a semiconductor substrate and a plurality of inversion storage capacitors are formed also at the surface of the semiconductor substrate in a spaced apart relationship from the charge source. Voltage pulses representing binary digits are applied to one terminal of the capacitors and the other terminal of the capacitors is coupled to the direct current source of charges by the application of a word pulse to a word line.

In an article entitled "Linearity of Electrical Charge Injection into Charge-Coupled Devices", by C. H. Sequin and A. M. Mohsen, in *IEEE Journal of Solid-State Circuits*, Vol. SC-10, No. 2, April 1975, pages 81–92, there is described a charge coupled device which uses pulse charge injection and a sink for excess charge drainage.

SUMMARY OF THE INVENTION

It is an object of this invention to provide an improved memory cell having a very small area and high speed which utilizes a single storage capacitor and a simplified switch.

It is another object of this invention to provide an improved memory array which has very high density with cells having strong signals.

It is still another object of this invention to provide a very high density memory array having cells which operate at high speeds and which is simple and inexpensive to fabricate.

Yet a further object of this invention is to provide an improved memory array with cells having strong signals without the cells being dependent on their position in the array.

A further object of this invention is to provide an improved word organized, very dense memory array with reduced bit interference.

Still another object of this invention is to provide an improved high density memory array wherein bit pattern dependence is significantly alleviated.

In accordance with the teaching of this invention, a memory cell is produced in a semiconductor substrate having a given conductivity type by providing a source of charge pulses at the surface of the substrate and first and second conductive plates with a dielectric medium disposed between the substrate and the plates. A word line is connected to the first plane and a bit line is connected to the second plate. Voltages on the word and bit lines produce inversion layers at the substrate surface to form, with the plates, inversion capacitors. The first and second plates are arranged so that a continuous inversion layer is formed from the charge source to one of the inversion capacitors through the inversion layer of the other capacitor. Information is stored in the cell by storing predetermined amounts of charges, preferably electrons, from the pulsed charge source into depletion wells produced by the voltage on the bit line. The charge pulses from the source are timed so that a pulse begins at least by the onset of the word pulse and terminates prior to the termination of the word pulse. Furthermore, after the termination of the charge pulse and prior to the termination of the word pulse, the voltage at the charge source is set to form a charge sink for draining excess charges.

The foregoing and other objects, features and advantages of the invention will be apparent from the following more particular description of the preferred embodiment of the invention, as illustrated in the accompanying drawings.

BRIEF DESCRIPTION OF THE DRAWINGS

FIG. 1A is a plan view of an embodiment of a semiconductor memory array of the present invention, FIG. 1B is a section taken through FIG. 1A at 1B—1B, FIG. 1C is a section taken through FIG. 1A at 1C—1C, FIG. 2 are a series of schematic diagrams indicating charge flow into depletion wells at different time periods, and FIG. 3 is a pulse program used to operate the memory array of the present invention.

DESCRIPTION OF THE PREFERRED EMBODIMENTS

Referring to FIGS. 1A, 1B and 1C in more detail, there is shown the memory array of the invention which includes a semiconductor substrate 10 having disposed therein diffusion regions 12 and 14. The substrate 10 may be of p type conductivity with the diffusion regions 12 and 14 of n+ type. Terminals 16 and 18 connect pulse sources 15 and 17 to diffusion regions 12 and 14, respectively, for producing pulses of charge. Thick oxide strips 19, or, if desired recessed oxide, are provided to isolate word lines W1 and W2 from each other. Disposed on the surface of the semiconductor substrate 10 between thick oxide strips 19 is a first insulation layer 20 which is preferably made of silicon dioxide. A second insulation layer 22, preferably made of silicon nitride, is formed over the first insulation layer 20 and over the thick oxide strips 19. The thickness of the silicon dioxide layer 20 may be, for example, 500 angstroms and the thickness of the silicon nitride layer 22 may be, for example, 200 angstroms. A plurality of conductive lines 24, 26, 28 and 30, arranged parallel to each other, are disposed over the insulating layers 20 and 22 between the diffusion regions 12 and 14. The conductive lines 24, 26, 28 and 30, preferably made of doped polycrystalline silicon, are covered with insulating layers of oxidized polycrystalline silicon 32, 34, 36 and 38, respectively. Metal lines 40 and 41 are disposed over the conductive lines 24, 26, 28 and 30 in a direction orthogonal to the direction of the conductive lines 24, 26, 28 and 30. The conductive lines and the metal lines are insulated from each other by the insulating layers 32, 34, 36 and 38. The conductive lines 24, 26, 28 and 30 are portions of bit/sense lines B1, B2, B3 and B4, which are connected to unit 43, and the metal lines 40 and 41 are portions of the word lines W1 and W2, which are connected to word driver 45 which produces the necessary word pulses for word lines W1 and W2. The unit 43 includes any suitable bit drivers, sense amplifiers and a bias source.

The bit drivers of unit 43 apply voltages representing binary digits to bit/sense lines B1, B2, B3 and B4. The voltages applied to these bit/sense lines produce depletion wells in the semiconductor substrate 10, as indicated by dashed lines 42, 44, 46 and 48 in FIG. 1C. The depth of each of these depletion wells depends upon the magnitude of the voltage applied to the respective conductive lines 24, 26, 28 and 30. These conductive lines 24, 26, 28 and 30 along with the depletion wells and the dual insulating layers 20 and 22 form storage capacitors 50, 52, 54 and 56 of the word line W1 defined by metal line 40. Likewise, word line W2 is associated with storage capacitors similar to capacitors 50, 52, 54 and 56. The storage capacitors associated with word line W2 are located at the intersection of the conductive lines 24, 26, 28 and 30 and the metal line 41. It can be seen in FIG. 1C that the depletion wells 42 and 46 associated with storage capacitors 50 and 54 are deeper than the potential wells 44 and 48 associated with capacitors 52 and 56, respectively. It is assumed that the deeper potential wells 42 and 46 are produced to represent a 1 bit of binary information, whereas the shallower wells 44 and 48 represent a 0 bit of binary information.

In order to store information in capacitors 50, 52, 54 and 56 it is necessary to introduce charges into the potential wells of these capacitors from the diffusion regions 12 and 14. To introduce charges into the depletion wells 42, 44, 46, and 48, a conductive path is selectively produced between the sources 12 and 14 and each of the depletion wells 42, 44, 46 and 48. This path is produced by creating additional depletion wells 58 at the surface of the semiconductor substrate 10 between the diffusion regions 12 and 14 and the depletion wells 42 and 48, respectively, and also between the depletion wells 42 and 44, 44 and 46, and 46 and 48. These depletion wells 58, as indicated in FIG. 1C of the drawing, are produced by a word pulse having a positive polarity applied from word driver 45 to the word line W1. The charges flow from the diffusion regions 12 and 14 through depletion wells 58 into potential wells that are at a potential initially more positive than the potential applied to terminals 16 and 18 to form an inversion layer at the surface of the substrate 10. After depletion wells 42, 44, 46 and 48 are filled with the charges, the word pulse is terminated and the depletion wells 42, 44, 46 and 48, now forming inversion layers for inversion storage capacitors 50, 52, 54 and 56, are isolated from the charge sources 12 and 14 and from each other. The voltages on the bit lines B1, B2, B3 and B4 representing the binary information are pulsed back to the rest potential after the word line pulse has terminated and puddles or packets of charge of two different magnitudes remain in potential wells to represent the stored binary digits. When reading the stored information from the capacitors 50, 52, 54 and 56, the bit drivers are disconnected from the bit lines B1, B2, B3 and B4 and sense amplifiers are connected to these bit lines, as is well known in the art.

In FIG. 2 there is shown a series of schematic diagrams showing charge flow from the pulsed charge sources 15 and 17 at the different time periods indicated in the pulse program of FIG. 3 which is used in the operation of the memory array in accordance with the teachings of this invention. As can be seen from the pulse program of FIG. 3, pulse source 15 and 17 produce a charge injection pulse which is normally at +8.0 volts but is lowered to zero volts at predetermined intervals. The substrate 10 is preferably biased at −3.0 volts. The word pulse applied selectively to word line W1 and word line W2 varies between −2.0 and +4.5 volts and the bit pulse used to write information into the cells has a rest potential of +8.5 volts and +4.5 volts for writing a, e.g., 1 bit of information. When a, e.g., 1 bit of information is being read from a cell, the bit lines having the 1 bit stored therein experience a relatively strong positive charge signal, indicated as the sense signal in FIG. 3, while the other bit lines representing a 0 bit of information receive only a signal of substantially zero magnitude. Prior to writing information into the cells, all bit lines are +8.5 volts and the potential wells have a magnitude equal to that of wells 42 or 46.

Referring to FIGS. 2 and 3 in more detail, it can be seen that at time t1, when a 1 bit is being written into bit lines B2 and B4, the bit pulse voltage decreases to +4.5 volts, with the charge injection pulse at +8 volts, which prevents pulse sources 15 and 17 from supplying charge to the substrate 10. Furthermore, the word pulse, which is at −2.0 volts, will not produce depletion wells 58. Accordingly, as can be seen at t1 in FIG. 2, depletion wells 42, 44, 46 and 48 have been formed in the substrate 10 but no charges have been introduced into these wells from pulse sources 15 and 17. At time t2 the charge injection pulse is lowered to zero volts providing a large supply of charges which flow into the potential wells 42, 44, 46 and 48 as soon as the word pulse is raised to +4.5 volts to produce the potential wells 58. The potential wells 58 produce a conductive path between the pulse sources 15 and 17 and the potential wells 42, 44, 46 and 48. Charges are indicated in FIG. 2 as shaded lines. By lowering the pulse source voltage to zero volts, a large overdrive condition is created which rapidly fills the potential wells 42, 44, 46 and 48 with charge, as indicated in FIG. 2 at t2. At time t3, after the wells have been filled, the charge injection pulse is again raised to +8 volts which now causes the pulse source 15 and 17 to act as drains which attract all charges in the depletion wells 42, 44, 46 and 48 above the barrier level produced by depletion wells 58, as indicated in t3 of FIG. 2. After all excess charges have been drained into the pulse sources 15 and 17, the word pulse voltage is lowered to −2.0 volts to very securely trap the remaining charges in the wells 42, 44, 46 and 48. It can be seen in t3 of FIG. 2 that very little, if any, charge remains in the potential wells 44 and 48, which represent 1 bit of information, since these wells are at substantially the same potential as potential wells 58, both being produced by the +4.5 volts applied to the dual insulation medium 20, 22. Furthermore, the wells 42, 44, 46 and 48 are now isolated and the bit pulse voltage is returned to 8.5 volts with relatively large puddles or packets of charge remaining in depletion wells 42 and 46, and little or no charge being stored in depletion wells 44 and 48, as shown at t4 in FIG. 2. It should be noted from FIG. 3 that when a 0 bit of information is to be written into a cell the bit pulse voltage simply remains at the rest potential of +8.5 volts. During the read operation, the bit pulse voltage on all bit lines is floated and connected to the sense amplifiers and the charge inject pulse and the word pulse are set as indicated in FIG. 3 during times t1 through t4 with the sense signal indicating on the bit lines B1, B2, B3 and B4 a relatively large positive discharge for 1 bits and little or no discharge for 0 bits.

It should also be noted that by employing pulse charge injection as taught by this invention, the potential wells can be rapidly overdriven with charges and then the excess charges rapidly drained off into a sink. By employing this technique all wells of cells along a word line can be very precisely filled within a very short period of time irrespective of bit position and bit patterns to reduce the memory cycle without disturbing information stored in cells associated with other word lines which share the common bit lines.

It should be noted more particularly that by maintaining the word pulse voltage at −2.0 volts on all word lines except for the select word line, the cells of the other or unselected word lines are protected from the low voltage, i.e., +4.5 which may be applied to a bit line used to store a 1 bit in the selected word. Furthermore, by raising the voltage of the pulse sources to +8 volts after injecting charges into the wells, excess charges which could cause a rapid deterioration of the stored information are removed from the memory array. The deterioration could be caused by permitting the excess charges to spill into the potential wells representing 1 bit, thus decreasing the difference in amount of charge stored in 1 bit wells and in 0 bit wells. Of course, it should be understood that since the memory of this invention utilizes dynamic cells, it must be refreshed within predetermined time intervals in order to prevent the loss of stored information. Any known suitable refreshing technique may be employed.

While the invention has been particularly shown and described with reference to a preferred embodiment thereof, it will be understood by those skilled in the art that various changes in form and details may be made without departing from the spirit and scope of the invention.

What is claimed is:

1. A capacitance memory comprising,
   a semiconductor substrate,
   a dielectric medium disposed on said substrate,
   conductive means disposed on said dielectric medium defining a storage node at a given region on the surface of said substrate,
   means for applying data signals to said conductive means,
   a source of reference potential having selectable first and second potential levels disposed at the surface of said substrate a given distance from said given region, and
   means for selectively coupling said source of reference potential at predetermined time intervals to said given region, said source of reference potential being alternately at said first and second levels during each of said predetermined intervals.

2. A capacitance memory as set forth in claim 1 wherein said conductive means forms an inversion capacitor having an inversion layer and said selectively coupling means couples said source to said inversion layer.

3. A capacitance memory as set forth in claim 2 wherein said source is capable of producing charges in said substrate at said first level and said source attracts charges at said second level.

4. A capacitance memory as set forth in claim 3 wherein said data signal applying means apply said signals to said conductive means during said predetermined time intervals.

5. A capacitor memory as set forth in claim 4 wherein said source has the first level preceding the second level.

6. A capacitor memory as set forth in claim 5 wherein applying means applies said signals for a period of time extending beyond each of said predetermined time intervals.

7. A capacitance memory comprising,
   a semiconductor substrate having a given conductivity type,
   means for applying a reference voltage to a given region of said substrate for producing a source of charges at a first magnitude and a drain for attracting charges at a second magnitude,
   an insulating medium disposed on said substrate,
   a plurality of spaced apart conductive lines disposed on said insulating medium,
   a conductive control line arranged on said insulating medium and substantially orthogonal to and over said plurality of conductive lines, said control line extending from said reference voltage applying means to each of said spaced apart conductive lines,
   means for applying data voltage pulses at a given time interval to said plurality of spaced apart lines, and
   means for applying a control voltage pulse to said control line to couple said reference voltage applying means to each of said spaced apart conductive lines during said given time interval, said reference voltage applying means producing charges at a first portion of said given time interval and attracting charges into said drain during a second portion of said time interval.

8. A capacitance memory as set forth in claim 7 wherein said data voltage applying means applies voltages of first and second magnitudes to said spaced apart lines and the magnitude of said control voltage is equal to that of said first magnitude.

9. A capacitance memory as set forth in claim 8 wherein said data voltage means applies voltages of said second magnitude to each of said spaced apart lines at a time period subsequent to the termination of said control voltage pulse.

10. A capacitance memory as set forth in claim 9 further including means coupled to said plurality of spaced apart lines for detecting charge upon the application of said control pulse when each of said spaced apart lines have applied thereto voltages of said second magnitude.

11. A capacitance memory is set forth in claim 8 wherein said control voltage pulse applying means has a first voltage magnitude for creating a potential well in said substrate and a second voltage magnitude for suppressing a potential well.

* * * * *